United States Patent [19]

Yanagigawa

[11] Patent Number: 5,523,601

[45] Date of Patent: Jun. 4, 1996

[54] HIGH-BREAKDOWN-VOLTAGE MOS TRANSISTOR

[75] Inventor: Hiroshi Yanagigawa, Shiga, Japan

[73] Assignee: NEC Corporation, Japan

[21] Appl. No.: 353,080

[22] Filed: Dec. 9, 1994

[30] Foreign Application Priority Data

Dec. 17, 1993 [JP] Japan .................................. 5-317574

[51] Int. Cl.[6] ................................................. H01L 23/58
[52] U.S. Cl. ........................... 257/339; 257/409; 257/492; 257/493
[58] Field of Search .................... 257/335, 339, 257/341, 342, 343, 409, 491, 492, 493, 336

[56] References Cited

U.S. PATENT DOCUMENTS 4,422,089 12/1983 Vaes et al. ............................. 257/491
4,922,327 5/1990 Mena et al. ............................ 257/336

FOREIGN PATENT DOCUMENTS 2-60169   2/1990  Japan .................................... 257/491
4-125972  4/1992  Japan .................................... 257/491

*Primary Examiner*—Rolf Hille
*Assistant Examiner*—Minhloan Tran
*Attorney, Agent, or Firm*—Laff, Whitesel, Conte & Saret, Ltd.

[57] ABSTRACT

A high-breakdown-voltage MOS transistor includes a substrate of one conductivity and a semiconductor layer of the other conductivity type, a drain electrode, a diffusion layer of one conductivity type, a base region of one conductivity type, a source region, a gate electrode, a source electrode, and a heavily doped layer. The diffusion layer and the substrate are electrically connected to the source region.

5 Claims, 3 Drawing Sheets

HIGH-BREAKDOWN-VOLTAGE MOS TRANSISTOR

BACKGROUND OF THE INVENTION

The present invention relates to a high-breakdown-voltage MOS transistor and, more particularly, to a lateral high-breakdown-voltage MOS transistor having a double-RESURF (REduced SURface Field) structure.

For example, a detailed structure of a conventional lateral high-breakdown-voltage MOS transistor having a double-RESURF structure will be described below with reference to FIG. 3. Note that, in the following structure, two gate electrodes 12 are symmetrically arranged on both the sides of a drain electrode 6.

In this high-breakdown-voltage MOS transistor, an n-type epitaxial layer 2 is formed on a p-type substrate 1, and p-type diffusion is selectively performed at a high concentration to form a diffusion separation layer 15, thereby separating the n-type epitaxial layer 2 serving as a drain from a junction.

On the surface of the n-type epitaxial layer 2, an impurity is selectively diffused in a portion around a region 5 for prospectively forming a drain electrode 6 such that the impurity is not diffused in the region 5, thereby forming a p-type diffusion layer 3. In addition, a field oxide film 4 is formed on the p-type diffusion layer 3. A gate electrode 12 is patterned on the surface of the epitaxial layer 2 outside the field oxide film 4 through a gate oxide film 11 using polysilicon or the like to have a predetermined gate length.

A p-type impurity is diffused in a portion outside the gate electrode 12 to connect a base region 7 to the diffusion separation layer 15, and the impurity is diffused in a lateral direction to form the base region 7 under the gate electrode 12. When the n-type impurity is diffused in the base region 7, a source region 9 is formed inside the base region 7 such that the source region 9 is in contact with the outer side of the gate electrode 12. At the same time, an n-type impurity is diffused in the region 5 for prospectively forming the drain electrode 6. A p-type heavily doped base contact region 8 is formed on a portion where the source region 9 is not formed on the base region 7, and the drain electrode 6 and a source electrode 10 are formed.

Although not shown, the diffusion layer 3 and the substrate 1 are electrically connected to the source electrode 10.

In the high-breakdown-voltage MOS transistor having the double-RESURF structure, when a voltage is applied across the source electrode 10 and the drain electrode 6 to increase the potential thereacross, depletion layers n and m respectively extend at the junction portion between the substrate 1 and the epitaxial layer 2 and the junction portion between the n-type epitaxial layer 2 and the p-type diffusion layer 3. When the potential between the source electrode 10 and the drain electrode 6 reaches a predetermined potential, the depletion layers m and n extending from the two junction portions are connected to each other to completely deplete the epitaxial layer 2, and the epitaxial layer 2 is fixed at the potential obtained at this time. When the diffusion layer 3 is completely depleted up to this, the epitaxial layer 2 is fixed at this potential. For this reason, the diffusion layer 3 functions as a field relaxation layer, thereby realizing a high-breakdown-voltage MOS transistor.

In the conventional MOS transistor described above, the concentration of the epitaxial layer 2 is set such that the epitaxial layer 2 is completely depleted until the potential between the source electrode 10 and the drain electrode 6 reaches a potential at which breakdown occurs in the gate oxide film 11. For this reason, the concentration of the epitaxial layer 2 is determined depending on the thickness of the gate oxide film 11, and a drain resistance is determined by the concentration. For this reason, an ON resistance cannot be easily increased to a resistance higher than the drain resistance disadvantageously.

To decrease the ON resistance, for example, a MOS transistor disclosed in Japanese Patent Laid-Open Nos. 4-125972 (Reference 1) and 2-60169 (Reference 2) are used.

However, both the above MOS transistors are of a vertical type. In the MOS transistor disclosed in Reference 1, a heavily doped layer is formed at a portion in which a depletion layer extends. For this reason, when the concentration of the heavily doped layer is set to be excessively high to decrease the ON resistance, the breakdown voltage of the MOS transistor is disadvantageously decreased. In this MOS transistor, the concentration of the heavily doped layer is disadvantageously limited. In addition, in the MOS transistor disclosed in Reference 2, a heavily doped layer cannot be formed deeper than a junction portion in which a depletion layer is formed. For this reason, an ON resistance cannot be easily decreased. In this MOS transistor, the depth of the heavily doped layer is disadvantageously limited.

SUMMARY OF THE INVENTION

It is an object of the present invention to provide a high-breakdown-voltage MOS transistor capable of decreasing an ON resistance without limiting the concentration and depth of a heavily doped layer, while a breakdown voltage is kept high.

In order to achieve the above object of the present invention, there is provided a high-breakdown-voltage MOS transistor comprising a semiconductor layer of the other conductivity type formed on a semiconductor substrate of one conductivity type and serving as a drain region, a drain electrode formed on the semiconductor layer of the other conductivity type, a diffusion layer of one conductivity type selectively formed on the semiconductor layer of the other conductivity type to surround the drain electrode, a base region of one conductivity type formed on the semiconductor layer of the other conductivity type such that the base region is adjacent to an outer side of the diffusion layer of one conductivity type, a source region formed in the base region of one conductivity type, a gate electrode formed, through a gate insulating film, on a junction portion, of the semiconductor layer of the other conductivity type, serving as the drain region and the base region of one conductivity type between the source region and the diffusion layer of one conductivity type, a source electrode formed on the semiconductor substrate of one conductivity type such that the source electrode is connected to the source region, and a heavily doped layer formed on the semiconductor layer of the other conductivity type serving as the drain region immediately below the gate electrode, wherein the source electrode connected to the semiconductor layer of the other conductivity type serving as a drain region which is connected to the semiconductor substrate of one conductivity type, the diffusion layer of one conductivity type, and the base region at the same potential.

DESCRIPTION OF THE PREFERRED EMBODIMENT

Figure 1:
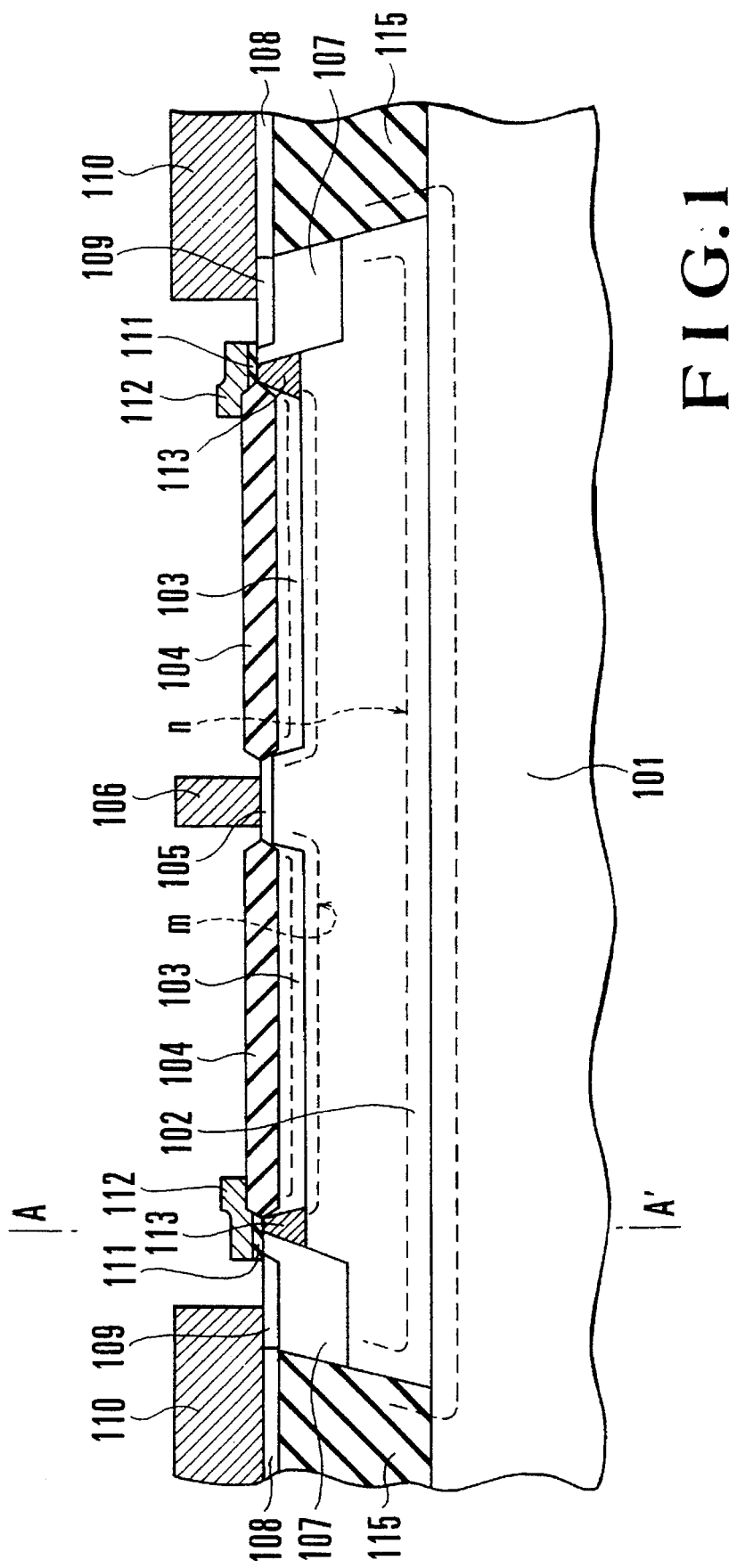
FIG. 1 is sectional view showing a high-breakdown-voltage MOS transistor according to an embodiment of the present invention.
Figure 2:
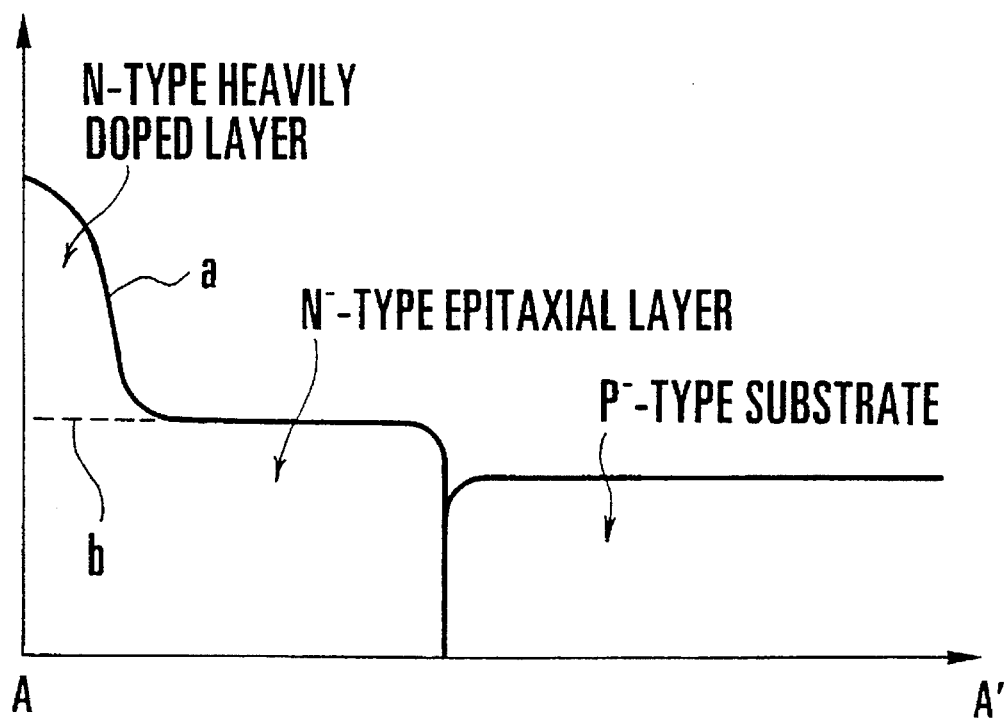
FIG. 2 is a graph showing concentration profiles for comparing the concentration distribution of the prior art with that of the present invention.

A high-breakdown-voltage MOS transistor according to an embodiment of the present invention will be described below in detail with reference to FIGS. 1 and 2.

In a high-breakdown-voltage MOS transistor according to this embodiment, an n-type epitaxial layer 102 is formed on a p-type substrate 101, and p-type diffusion is selectively performed at a high concentration to form a diffusion separation layer 115, thereby separating the n-type epitaxial layer 102 serving as a drain from a junction.

On the surface of the n-type epitaxial layer 102, an impurity is selectively diffused in a portion around a region 105 for prospectively forming a drain electrode 106 such that the impurity is not diffused in the region 105, thereby forming a p-type diffusion layer 103. In addition, a field oxide film 104 is formed on the p-type diffusion layer 103. Heavily doped n-type diffusion is selectively performed in the n-type epitaxial layer 102 outside the field oxide film 104 to form an n-type heavily doped layer 113 to a depth of the p-type diffusion layer 103. A gate electrode 112 is patterned on the heavily doped layer 113 and the n-type epitaxial layer 102 outside the heavily doped layer 113 through a gate oxide film 111 using polysilicon or the like to have a predetermined gate length.

A p-type impurity is diffused in the n-type epitaxial layer 102 outside the gate electrode 112 to connect a base region 107 to the diffusion separation layer 115, and the impurity is diffused in a lateral direction to form the base region 107 under the gate electrode 112. In this manner, the gate electrode 112 is formed on the heavily doped layer 113 such that the gate electrode 112 is in contact with the base region 107. When the n-type impurity is diffused in the base region 107, a source region 109 is formed on the surface of the base region 107 such that the source region 109 is in contact with the outside of the gate electrode 112. At the same time, an n-type impurity is diffused in the region 105 for prospectively forming the drain electrode 106. A p-type heavily doped base contact region 108 is formed on a portion where the source region 109 is not formed on the base region 107. The drain electrode 106 is formed on the region 105 for prospectively forming the drain electrode 106, and the source electrode 110 is formed on the source region 109 and the base contact region 108.

Note that the p-type diffusion layer 103 and the p-type substrate 101 are electrically connected to the source electrode 110.

Figure 3:
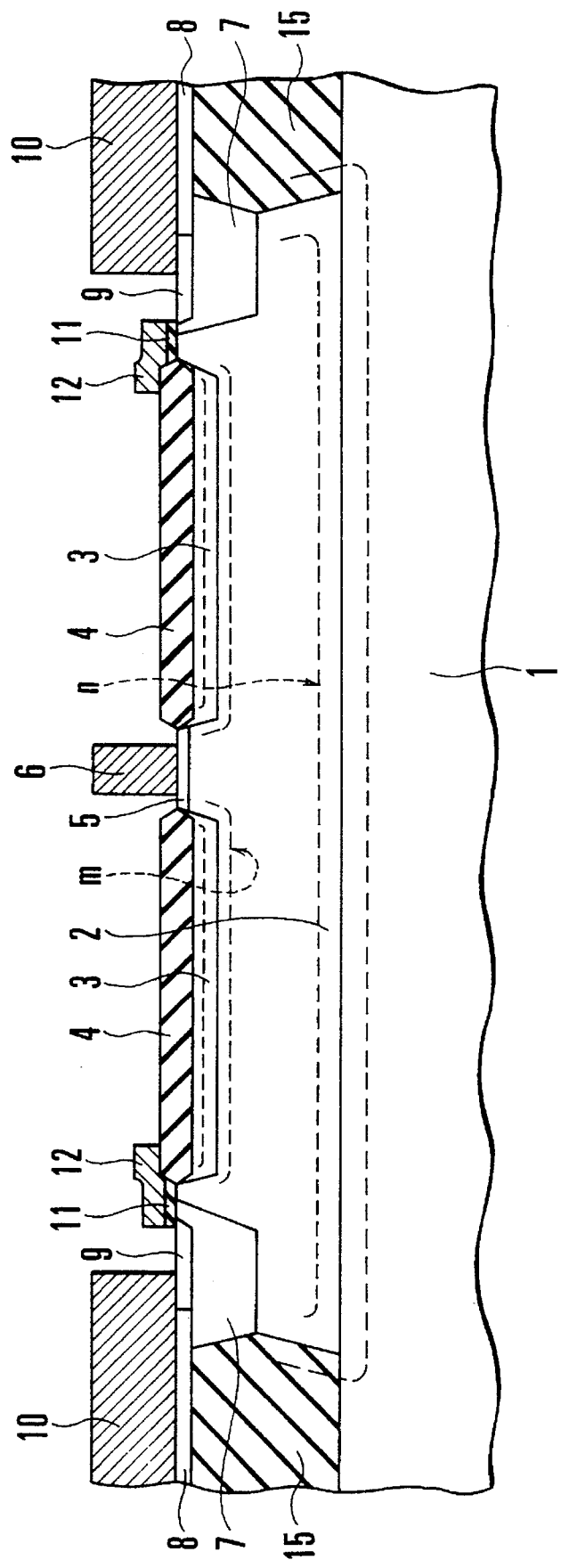
FIG. 3 is a sectional view showing a conventional high-breakdown-voltage MOS transistor.

As described above, in a high-breakdown-voltage MOS transistor according to the present invention, unlike the conventional high-breakdown-voltage MOS transistor shown in FIG. 3, the heavily doped layer 113 is formed on the epitaxial layer 102 located immediately below the gate electrode 112. Therefore, as shown in FIG. 2, the characteristics of the prior art have an impurity concentration profile in which a concentration distribution of a portion extending from the surface portion of the epitaxial layer 102 to the deep portion thereof is almost constant. However, the characteristics of the MOS transistor of the present invention have an impurity concentration profile, of a portion indicated by an A–A' broken line in FIG. 1, in which the surface portion of the epitaxial layer 102 has a concentration higher than that of the deep portion of the epitaxial layer 102.

In the MOS transistor according to the present invention, as in a conventional MOS transistor, when a voltage is applied across the source electrode 110 and the drain electrode 106 to increase the potential thereacross, depletion layers n and m respectively extend at the junction portion between the p-type substrate 101 and the n-type epitaxial layer 102 and the junction portion between the n-type epitaxial layer 102 and the p-type diffusion layer 103. When the potential between the source electrode 110 and the drain electrode 106 reaches a predetermined potential, the depletion layers m and n extending from the two junction portions are connected to each other to completely deplete the epitaxial layer 102, and the epitaxial layer 102 is fixed at the potential obtained at this time. When the diffusion layer 103 is completely depleted up to this, the epitaxial layer 102 is fixed at this potential. For this reason, the diffusion layer 103 functions as a field relaxation layer, thereby realizing a high-breakdown-voltage MOS transistor.

In this case, in the MOS transistor according to the present invention, even if a heavily doped layer 113 of the other conductivity type is formed in a predetermined portion adjacent to the diffusion layer 103 of the epitaxial layer 102, i.e., in the channel region of the epitaxial layer 102 located immediately below the gate electrode 112, the concentration of the epitaxial layer 102 below the diffusion layer 103 is not changed. For this reason, while a potential at which the epitaxial layer 102 is depleted is kept, the epitaxial layer 102 is fixed at this potential. Therefore, while the breakdown voltage of the MOS transistor is kept high without being decreased, an ON resistance can be decreased in the presence of the heavily doped layer 113 in the channel region immediately below the gate electrode 112.

In the above embodiment, although the epitaxial layer 102 is used as a semiconductor layer of the other conductivity type serving as a drain, a substrate formed by an adhering technique may be used as the semiconductor layer.

In a high-breakdown-voltage MOS transistor according to the present invention, while a breakdown voltage is kept high without being decreased, a heavily doped layer is formed in a channel region located immediately below a gate electrode. For this reason, the concentration of an epitaxial layer can be increased at its surface portion, and an ON resistance can be easily decreased, so that the characteristics of the high-breakdown-voltage MOS transistor can be improved.

What is claimed is:

1. A high-breakdown-voltage MOS transistor comprising:
   a semiconductor layer of another conductivity type formed on a semiconductor substrate of one conductivity type and serving as a drain region;
   a drain electrode formed on said semiconductor layer of the other conductivity type;
   a diffusion layer of said one conductivity type selectively formed on said semiconductor layer of the other conductivity type to surround said drain electrode, said diffusion layer having an outer side;
   a base region of said one conductivity type formed on said semiconductor layer of the other conductivity type so that said base region is adjacent to said outer side of said diffusion layer of said one conductivity type;
   a source region formed on said base region of said one conductivity type;
   a gate insulating film;

a gate electrode formed through said gate insulating film on a junction portion of said semiconductor layer of the other conductivity type, serving as said drain region and said base region of said one conductivity type between said source region and said diffusion layer of said one conductivity type;

a source electrode formed on said semiconductor substrate of said one conductivity type so that said source electrode is connected to said source region; and a heavily doped layer formed on said semiconductor layer of the other conductivity type serving as said drain region immediately below said gate electrode, said gate electrode being formed on said heavily doped layer so that said gate electrode is in contact with said base region of one conductivity type.

2. A transistor according to claim 1, wherein said semiconductor layer of the other conductivity type serving as said drain region is formed by epitaxially growing said semiconductor substrate of said one conductivity type.

3. A transistor according to claim 1, wherein said semiconductor layer of the other conductivity type serving as said drain region is formed such that said semiconductor layer of the other conductivity type adheres on said semiconductor substrate of said one conductivity type.

4. A transistor according to claim 1, wherein said source electrode is connected to said semiconductor substrate of said one conductivity type, said diffusion layer of one conductivity type and said base region at the same potential.

5. A high-breakdown-voltage MOS transistor comprising:

a semiconductor layer of another conductivity type formed on a semiconductor substrate of one conductivity type and serving as a drain region;

a drain electrode formed on said semiconductor layer of the other conductivity type;

a diffusion layer of said one conductivity type selectively formed on said semiconductor layer of the other conductivity type to surround said drain electrode, said diffusion layer having an outer side;

a base region of said one conductivity type formed on said semiconductor layer of the other conductivity type so that said base region is adjacent to said outer side of said diffusion layer of said one conductivity type;

a source region formed on said base region of said one conductivity type;

a gate insulating film;

a gate electrode formed through said gate insulating film on a junction portion of said semiconductor layer of the other conductivity type, serving as said drain region and said base region of said one conductivity type between said source region and said diffusion layer of said one conductivity type;

a source electrode formed on said semiconductor substrate of said one conductivity type so that said source electrode is connected to said source region; and a heavily doped layer formed on said semiconductor layer of the other conductivity type serving as said drain region immediately below said gate electrode, said heavily doped layer being formed on said semiconductor layer of the other conductivity type and extending to a depth equal to a depth of said diffusion layer of said one conductivity type.

\* \* \* \* \*